United States Patent
Wu et al.

(10) Patent No.: US 9,396,792 B2
(45) Date of Patent: Jul. 19, 2016

(54) ADJUSTING LOG LIKELIHOOD RATIO VALUES TO COMPENSATE MISPLACEMENT OF READ VOLTAGES

(71) Applicant: Seagate Technology LLC, Cupertino, CA (US)

(72) Inventors: Yunxiang Wu, Cupertino, CA (US); Zhengang Chen, San Jose, CA (US); AbdelHakim S. Alhussien, San Jose, CA (US); Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 206 days.

(21) Appl. No.: 14/195,058

(22) Filed: Mar. 3, 2014

(65) Prior Publication Data

US 2015/0243363 A1    Aug. 27, 2015

Related U.S. Application Data (60) Provisional application No. 61/944,696, filed on Feb. 26, 2014.

(51) Int. Cl.
    *H03M 13/00* (2006.01)
    *G11C 11/56* (2006.01)
    *G06F 11/10* (2006.01)
    *G11C 29/52* (2006.01)

(52) U.S. Cl.
    CPC ........ *G11C 11/5642* (2013.01); *G06F 11/1048* (2013.01); *G06F 11/1072* (2013.01); *G11C 29/52* (2013.01)

(58) Field of Classification Search
    CPC .............. G11C 16/349; G11C 11/5642; G06F 11/1048
    See application file for complete search history.

(56) References Cited

U.S. PATENT DOCUMENTS

| | | | | |
|---|---|---|---|---|
| 7,966,546 B2* | 6/2011 | Mokhlesi | ............ | G06F 11/1068 714/773 |
| 8,213,255 B2* | 7/2012 | Hemink | .................. | G11C 7/04 365/185.18 |
| 8,229,039 B2* | 7/2012 | Shen | ................. | H03M 13/2957 375/259 |
| 8,341,488 B2* | 12/2012 | Blanksby | ......... | H03M 13/1137 375/262 |
| 8,397,116 B2* | 3/2013 | No | .................... | H03M 13/1108 714/746 |
| 8,429,501 B2 | 4/2013 | Tseng et al. | .................. | 714/773 |
| 8,468,431 B2* | 6/2013 | Steiner | ................. | H03M 13/09 714/780 |
| 8,549,380 B2 | 10/2013 | Motwani | ....................... | 714/763 |
| 8,549,385 B2 | 10/2013 | Yang | .............................. | 714/773 |
| 9,036,438 B2* | 5/2015 | Hemink | .................. | G11C 7/04 365/185.18 |
| 9,117,529 B2* | 8/2015 | Karakulak | ............. | G11C 16/10 |
| 2011/0239092 A1 | 9/2011 | Horisaki | ....................... | 714/773 |
| 2014/0010009 A1 | 1/2014 | Chilappagari et al. | ...... | 365/185.2 |
| 2014/0040704 A1 | 2/2014 | Wu et al. | ........................ | 714/773 |

\* cited by examiner

*Primary Examiner* — Esaw Abraham
(74) *Attorney, Agent, or Firm* — Christopher P. Maiorana, PC (57) ABSTRACT

An apparatus having a circuit and an interface to a nonvolatile memory is disclosed. The circuit is configured to (i) perform one or more attempts of a soft-decision decode of data stored in the nonvolatile memory, where soft-decision decode uses a plurality of log likelihood ratio values stored in a table, (ii) generate one or more adjusted log likelihood ratio values by adding a constant value to one or more of the log likelihood ratio values in response to a failure to decode the data using the log likelihood ratio values and (iii) re-decode the data using the adjusted log likelihood ratio values.

20 Claims, 9 Drawing Sheets

ADJUSTING LOG LIKELIHOOD RATIO VALUES TO COMPENSATE MISPLACEMENT OF READ VOLTAGES

This application relates to U.S. Provisional Application No. 61/944,696, filed Feb. 26, 2014, which is hereby incorporated by reference in its entirety.

FIELD OF THE INVENTION

The invention relates to flash memory controllers generally and, more particularly, to a method and/or apparatus for implementing adjustments to log likelihood ratio values to compensate for misplacement of read voltages.

BACKGROUND

Soft error correction code decoders are commonly being used for NAND flash channels. The soft decoders are more powerful than hard decoders. However, the soft decoders use log likelihood ratio values as input data. Knowledge of the flash channels is a prerequisite to generate the log likelihood ratio values. In practice, exact channel knowledge is always not available. Furthermore, the estimated channel knowledge can simply be incorrect.

SUMMARY

The invention concerns an apparatus having a circuit and an interface to a nonvolatile memory. The circuit is configured to (i) perform one or more attempts of a soft-decision decode of data stored in the nonvolatile memory, where soft-decision decode uses a plurality of log likelihood ratio values stored in a table, (ii) generate one or more adjusted log likelihood ratio values by adding a constant value to one or more of the log likelihood ratio values in response to a failure to decode the data using the log likelihood ratio values and (iii) re-decode the data using the adjusted log likelihood ratio values.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing adjusting log likelihood ratio values to compensate for misplacement of read voltages that may (i) generate compensated log likelihood ratio values without creating a new table for the compensated values, (ii) adjust the log likelihood ratio values an amount directly related to the amount of misplacement of the read voltages, (iii) utilize a log likelihood ratio value histogram to aid in determining the amount of compensation and/or (iv) be implemented as one or more integrated circuits.

When soft error correction code decoders are used for NAND flash channels, channel log likelihood ratio values should be obtained as the input for the soft decoders. The log likelihood ratio values can be calculated on the fly or predefined values based on the channel characterization. In either way, one or more read voltages are set to read from the channel. The criterion of setting read voltages is to maximize a capacity of the channel. In order to correctly set the read voltages, implicit or explicit knowledge of cell voltage distributions is used. The cell voltage distributions makes flash channel signal processing challenging since the distributions change with a number of factors, including program/erase cycles, retention time, read disturb, outlier page (boundary pages), temperature, die-to-die variations, block-to-block variations and/or page-to-page variations. A background distribution tracking technique may be applied. However, the tracking techniques cannot guarantee that up-to-date distribution knowledge is available when a read is performed. For example, if computer is powered on for three weeks and then powered off, all the data has gained at least three weeks of retention.

When knowledge of the distributions is not correct, all calculated log likelihood ratio values and/or the predefined log likelihood ratio values are not as accurate as possible. For the best decoding results, the log likelihood ratio values should be adjusted. When misplacement of one or more read voltages happens, the predefined log likelihood ratio values and/or calculated log likelihood ratio values for a "narrow" decision region of read voltages are adjusted in real time by approximately the same amount (e.g., a constant is added to the log likelihood ratio values).

A feature of adjusting the log likelihood ratio values in real time is that memory space for a table is not consumed to save the adjusted log likelihood ratio values. Such a table could be large where dealing with a large range of misplacements of the read voltages. For example, if the flash channel is implemented with triple-level cells, the most significant bit pages alone have four read voltages. Each such read voltage may be compensated for in different directions resulting in many possible values.

Another feature of adjusting the log likelihood ratio values is that the amount of adjustment is directly related to the amount of misplacement of the read voltages. Large misplacements result in large adjustments (or compensation) of the corresponding log likelihood ratio values. Small misplacements results in small adjustment of the corresponding log likelihood ratio values.

A technique used for adjusting the log likelihood ratio values is summarized as following. When a nominal decoding fails after the last retry read, a constant value is added to one to all of the log likelihood ratio values of the "narrow" decision regions of the read voltages. Afterwards, soft re-decoding is attempted with the adjusted log likelihood ratio values. If the soft re-decoding still fails, different constant values are added to each the log likelihood ratio values. Thereafter, another soft re-decoding is attempted with the readjusted log likelihood ratio value. Generally many (e.g., 6 or 7) constant values can be used, each corresponding to a particular misplacement error of the read voltages.

Figure 1:
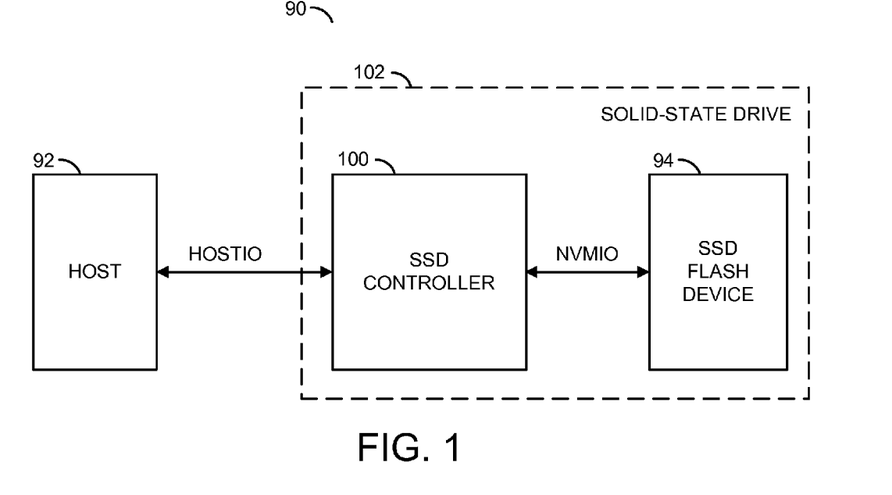
FIG. 1 is a block diagram of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94 and a block (or circuit) 100. The circuits 94 and 100 form a drive (or device) 102. The circuits 92 to 102 may represent modules and/or blocks that may be implemented as hardware, software, a combination of hardware and software, or other implementations.

One or more signals (e.g., HOSTIO) are exchanged between the circuit 92 and the circuit 100. The host input/output signal HOSTIO generally includes, but is not limited to, a logical address component used to access data in the circuit 102, a host command component that controls the circuit 102, a write data component that transfers write data from the circuit 92 to the circuit 100 and a read data component that transfers error corrected read data from the circuit 100 to the circuit 92. One or more signals (e.g., NVMIO) are exchanged between the circuit 100 and the circuit 94. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 100 into the circuit 94 and a read codeword component that carries the error correction coded codewords read from the circuit 94 to the circuit 100.

The circuit 92 is shown implemented as a host circuit. The circuit 92 is generally operational to read and write data to and from the circuit 94 via the circuit 100. When reading or writing, the circuit 92 transfers a logical address value in the signal HOSTIO to identify which set of data is to be written or to be read from the circuit 94. The address generally spans a logical address range of the circuit 102. The logical address can address individual data units, such as SATA (e.g., serial-ATA) sectors.

The circuit 94 is shown implementing one or more nonvolatile memory circuits (or devices). According to various embodiments, the circuit 94 comprises one or more nonvolatile semiconductor devices. The circuit 94 is generally operational to store data in a nonvolatile condition. When data is read from the circuit 94, the circuit 94 accesses a set of data (e.g., multiple bits) identified by the address (e.g., a physical address) in the signal NVMIO. The address generally spans a physical address range of the circuit 94.

In some embodiments, the circuit 94 may be implemented as a single-level cell (e.g., SLC) type circuit. A single-level cell type circuit generally stores a single bit per memory cell (e.g., a logical 0 or 1). In other embodiments, the circuit 94 may be implemented as a multi-level cell type circuit. A multi-level cell type circuit is capable of storing multiple (e.g., two) bits per memory cell (e.g., logical 00, 01, 10 or 11). In still other embodiments, the circuit 94 may implement a triple-level cell type circuit. A triple-level cell circuit stores multiple (e.g., three) bits per memory cell (e.g., a logical 000, 001, 010, 011, 100, 101, 110 or 111). A four-level cell type circuit may also be implemented. The examples provided are based on two bits per cell type devices and may be applied to all other types of nonvolatile memory.

Data within the circuit 94 is generally organized in a hierarchy of units. A block is a smallest quantum of erasing. A page is a smallest quantum of writing. A codeword (or read unit or Epage or ECC-page) is a smallest quantum of reading and error correction. Each block includes an integer number of pages. Each page includes an integer number of codewords.

The circuit 100 is shown implementing a controller circuit. The circuit 100 is generally operational to control reading to and writing from the circuit 94. The circuit 100 includes an ability to decode the read codewords received from the circuit 94. The resulting decoded data is presented to the circuit 92 via the signal HOSTIO and/or re-encoded and written back into the circuit 94 via the signal NVMIO. The circuit 100 comprises one or more integrated circuits (or chips or die) implementing the controller of one or more solid-state drives, embedded storage, or other suitable control applications.

As part of the decoding, the circuit 100 looks up decoding parameters (e.g., the log likelihood ratio values) stored in one or more internal tables. The decoding parameters are used as part of an iterative decoding procedure that attempts to correct any errors that may be present in the codewords. The decoding parameters generally inform the decoding procedure of a reliability for each respective bit of the codewords.

The circuit 102 is shown implementing a solid-state drive. The circuit 102 is generally operational to store data generated by the circuit 92 and return the data to the circuit 92. According to various embodiments, the circuit 102 comprises one or more: nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 102 is generally operational to store data in a nonvolatile condition.

Figure 2:
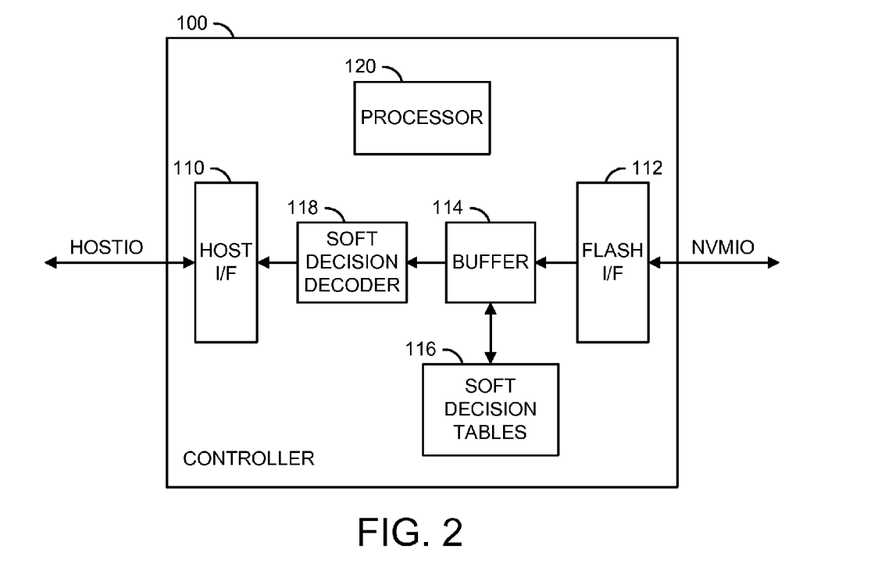
FIG. 2 is a block diagram of a controller in accordance with an embodiment of the invention.

Referring to FIG. 2, a block diagram of an example implementation of the circuit 100 is shown in accordance with an embodiment of the invention. The circuit 100 generally comprises a block (or circuit) 110, a block (or circuit) 112, a block (or circuit) 114, a block (or circuit) 116, a block (or circuit) 118 and a block (or circuit) 120. The circuits 110 to 120 may represent modules and/or blocks that may be implemented as hardware, software, a combination of hardware and software, or other implementations.

The circuit 110 is shown implemented as a host interface circuit. The circuit 110 is operational to provide communication with the circuit 92 via the signal HOSTIO. Other signals may be implemented between the circuits 92 and 110 to meet the criteria of a particular application.

The circuit 112 is shown implemented as a nonvolatile memory (e.g., flash) interface circuit. The circuit 112 is operational to provide communication with the circuit 94 via the signal NVMIO. Other signals may be implemented between the circuits 94 and 110 to meet the criteria of a particular application.

The circuit 114 is shown implemented as a buffer circuit. The circuit 114 is operational to buffer codewords received from the circuit 94 via the circuit 112. The circuit 114 is also operational to buffer decoding parameters generated by the circuit 116. The read codewords and the decoding parameters are presented from the circuit 114 to the circuit 118.

The circuit 116 is shown implemented as a soft-decision table circuit. The circuit 116 is operational to store and present decoding parameters (e.g., the log likelihood ratio values) used in a soft-decision decoding performed by the circuit 118. The decoding parameters are presented by the circuit 116 to the circuit 114 for buffering and/or, in other embodiments, directly to circuit 118. A hardware or firmware unit within the circuit 116 processes the sequences of bits received from the circuit 94 into hard decision patterns. The values are generally stored within the circuit 116 as one or more lookup tables.

The circuit 118 is shown implemented as a soft-decision decoder circuit. In some embodiments, the circuit 118 is implemented as one or more low density parity check decoder circuits. The circuit 118 is operational to perform both hard-decision (e.g., HD) decoding and soft-decision (e.g., SD) decoding of the codewords received from the circuit 114. The soft-decision decoding generally utilizes the decoding parameters presented by the circuit 116.

The circuit 120 is shown implemented as a processor circuit. The circuit 120 is operational to command and/or assist with the multiple read/write requests and to control one or more reference voltages used in the circuit 94 to read the codewords. The circuit 120 is also operational to adjust (or compensate) the log likelihood ratio values stored in the circuit 116 prior to use by the circuit 118.

Figure 3:
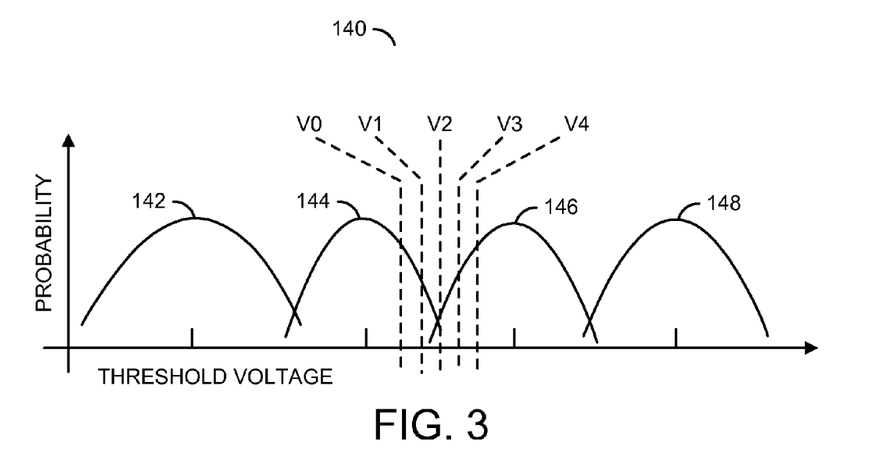
FIG. 3 is a diagram of cell threshold voltage distributions.

Referring to FIG. 3, a diagram of example cell threshold voltage distributions 140 is shown. The example is based on a multi-level type cell having four states 142, 144, 146 and 148. To perform a read using the log likelihood ratio soft-decision information, circuit 100 determines estimated cell voltage threshold distributions in accordance with a predetermined strategy and sets the read threshold voltages expected to work best in view of the estimated distributions. Setting the read threshold voltages affects a quality of the soft-decision decoding. In some embodiments, the thresholds are set to correspond to the crossing points of the distributions. For example, a read voltage V2 is shown approximately at a crossing point between the middle two states (e.g., 144 and 146). An initial log likelihood ratio set is subsequently selected (or calculated, if not precalculated) based on the estimated distributions.

In some embodiments, information in the individual reads, such as the disparity (e.g., a balance of 0's and 1's, given that data is scrambled and is nominally 50-50 in a 0/1 distribution) is used to select the nominal log likelihood ratio set. For example, for a least significant bit page read, the read that has the closest to 50-50 disparity is considered the "center" and would indicate a preferred log likelihood ratio set to use initially.

Even when a zero-one balance, or other distribution-tracking technique is used, no guarantee exists that the estimated distributions will always accurately represent the actual distributions. Accordingly, the calculated nominal log likelihood ratio set may not always be appropriate in view of the actual distributions, and an initial attempt based on the nominal log likelihood ratio set will sometimes fail.

Figure 4:
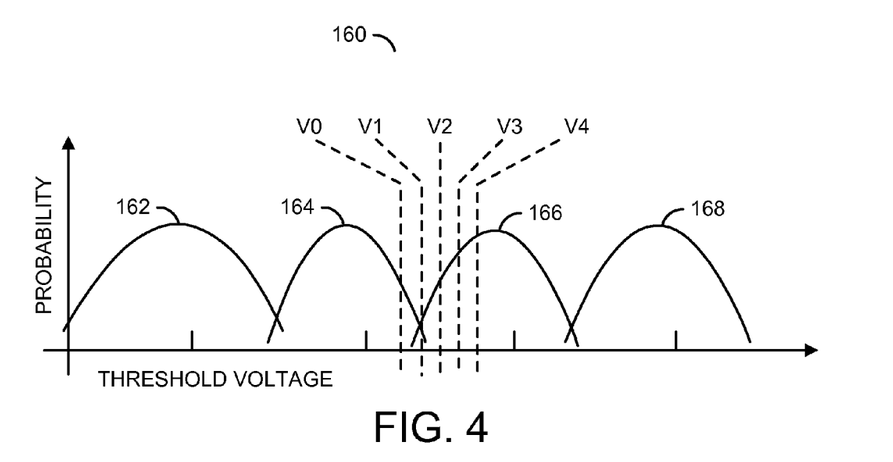
FIG. 4 is a diagram of shifted cell threshold voltage distributions.

Referring to FIG. 4, a diagram of example cell threshold voltage distributions 160 is shown. The example is based on the same multi-level type cell of FIG. 3 and has four states 162, 164, 166 and 168. In some embodiments, the log likelihood ratio soft-decision information sets are calculated at respective read voltage shifts, to enable compensation for corresponding mean shifts (and variance change, if appropriate) in actual distributions. An instance of actual distributions shifted by an exemplary amount relative to the estimated distributions is shown by the differences between distributions 140 and 160. In particular, the states 162-166 are all shifted to the left relative to the corresponding states 142-146. Therefore, the read voltage V1 is now at the crossing point between the middle two states (e.g., 164 and 166).

In some embodiments, such mis-estimations of the actual distributions are processed as follows. Subsequent to failure of an initial attempt based on the nominal log likelihood ratio set, soft-decision re-decoding attempts are made using the other precalculated compensated log likelihood ratio sets. Such re-decoding attempts eventually succeed, in some contexts, provided that the extent of the shifts of the actual distributions, with respect to the estimated distributions, is within the range of consideration for the precalculated log likelihood ratio sets.

The search order in which the various precalculated log likelihood ratio sets are tried varies by embodiment, including a center outwards ordering (e.g., alternating on either side of the center), a search downwards first and search upwards second ordering, and other predetermined orderings. For the exemplary shift of FIG. 4, successful decoding should result once the log likelihood ratio soft-decision set corresponding to the read voltage V1 is tried.

The soft-decision re-decoding will generally succeed without a retry read, which can consume significantly more time than the time of the re-decoding. According to various embodiments, soft-decision re-decoding attempts are performed without a retry read, or overlapped (e.g., performed concurrently, or in parallel) with one or more retry reads. In some embodiments, if re-decoding fails while overlapped with a first number of retry reads, the process is repeated with an increased number of retry reads. By overlapping re-decoding with one or more retry reads, the probability of successful decoding increases, the criteria for further retry reads diminishes, and throughput is improved.

Over a large number of retry reads, the final log likelihood ratio soft-decision information set can be adjusted on-the-fly by the circuit 120 to avoid storing even more log likelihood ratio information sets. Consider an example embodiment in which retry reads are made at 0.15-volt spacing. The log likelihood ratio soft-decision information sets are initially calculated and saved corresponding to some number (e.g., ten) of the read voltages. Subsequently, the circuit 116 stores the log likelihood ratio sets at a few (e.g., five) precalculated read voltages well positioned about the actual distributions. Adjusting the current log likelihood information set with the circuit 120 can span the actual distributions with many log likelihood soft-decision sets, enabling excellent bit error rates without implementing a large circuit 116 to store all of the sets. As a result, the log likelihood ratio compensation becomes effective over a number of retry reads, improving decoding reliability and achieving good bit error rates, even in the presence of large flash channel variation.

Figure 5:
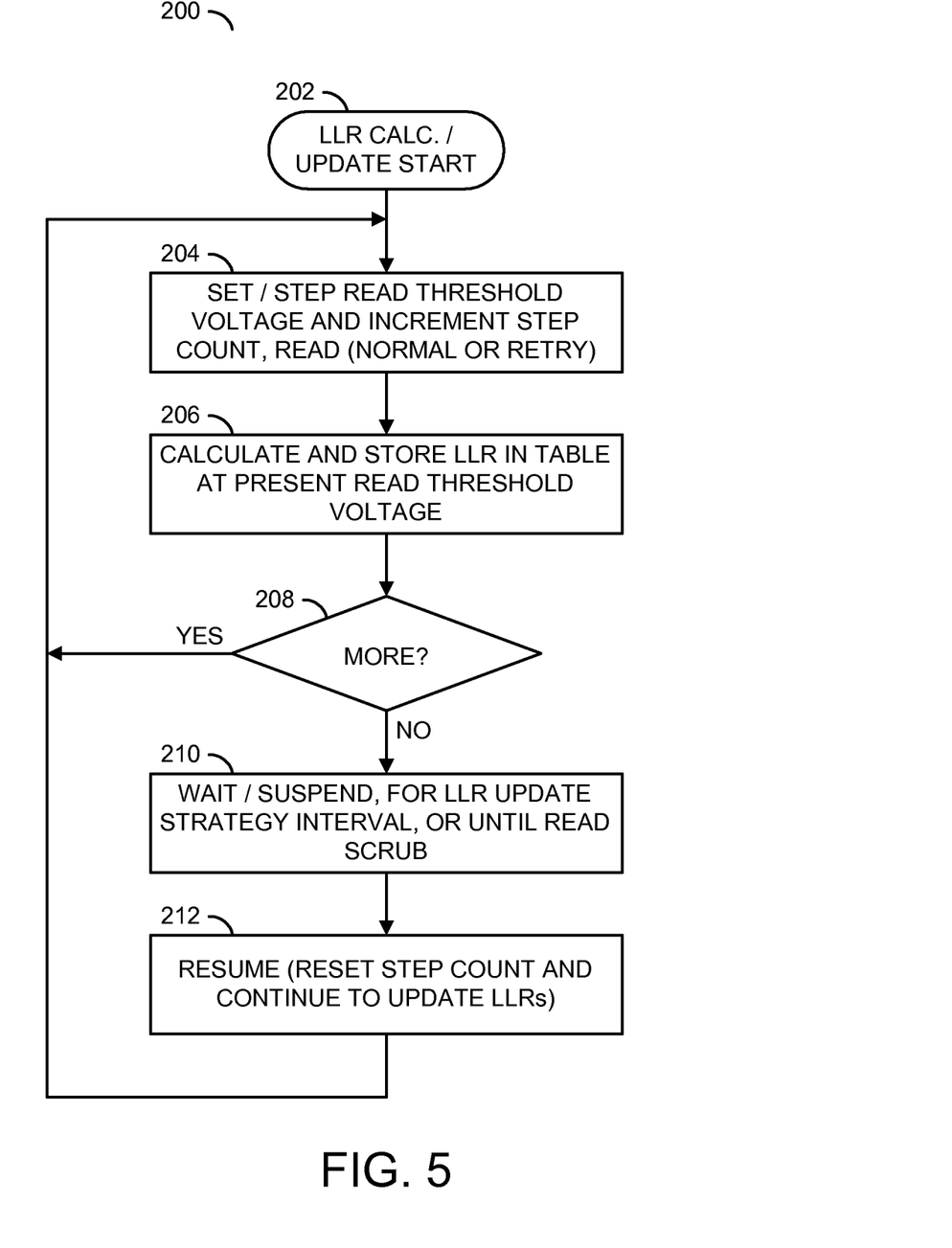
FIG. 5 is a flow diagram for initializing log likelihood ratio value sets.

Referring to FIG. 5, a flow diagram of an example method 200 for initializing the log likelihood ratio value sets is shown. The method (or process) 200 is generally implemented by the circuit 100 (e.g., the circuit 120). The method 200 generally comprises a step (or state) 202, a step (or state) 204, a step (or state) 206, a step (or state) 208, a step (or state) 210 and a step (or state) 212. The steps 202 to 212 may represent modules and/or blocks that may be implemented as hardware, software, a combination of hardware and software, or other implementations. The sequence of the steps is shown as a representative example. Other step orders may be implemented to meet the criteria of a particular application.

The log likelihood ratio value calculations can be performed for normal reads, retry reads, diagnostic and/or other system management reads preformed on demand or as a background task. In some embodiments, the log likelihood ratio values calculations are performed in advance of actual use. Once calculated, the values are stored in the circuit 116 for subsequent use, until the values are replaced as the result of an update. Inner and outer processing loops are shown. The inner loop includes actions 204 and 206, and an action (loop test) 208. The outer loop includes the inner loop plus the actions 210 and 212.

The method 200 generally begins at the step 202. In the step 204, initial settings and/or subsequent stepping (as appropriate) of the read threshold voltage, incrementing a loop step count, and performing a normal or retry read (according to circumstance) is performed. The step 206 generally includes calculating and storing a log likelihood ratio value at the present read threshold voltage. The inner loop step 208 evaluates whether the steps 204 and 206 should be repeated. If additional log likelihood ratio values are to be calculated at other (stepped) read threshold voltages, the step 208 returns to the step 204. According to some embodiments, the inner loop is repeated for a predetermined or configured loop count, for example, a loop count of 5, or 10.

Once the appropriate number of the log likelihood ratio values have been calculated, the inner loop is exited. In the step 210, the overall process waits (or is suspended) in accordance with a predetermined log likelihood ratio update strategy, or until a read scrub occurs. According to various embodiments, the log likelihood ratio update strategy includes waiting a day, a week, or another predetermined or configured interval. Once the criteria of the step 210 is satisfied, the method 200 resumes with the step 212. In the step 212, a step count is reset in preparation for starting the inner loop again. The outer loop thus completes, returning the control flow to the step 204, and the process repeats. In some embodiments, the method 200 also calculates a default read threshold voltage, a read threshold voltage increment, and/or other parameters to be used when reading from the circuit 94.

Figure 6:
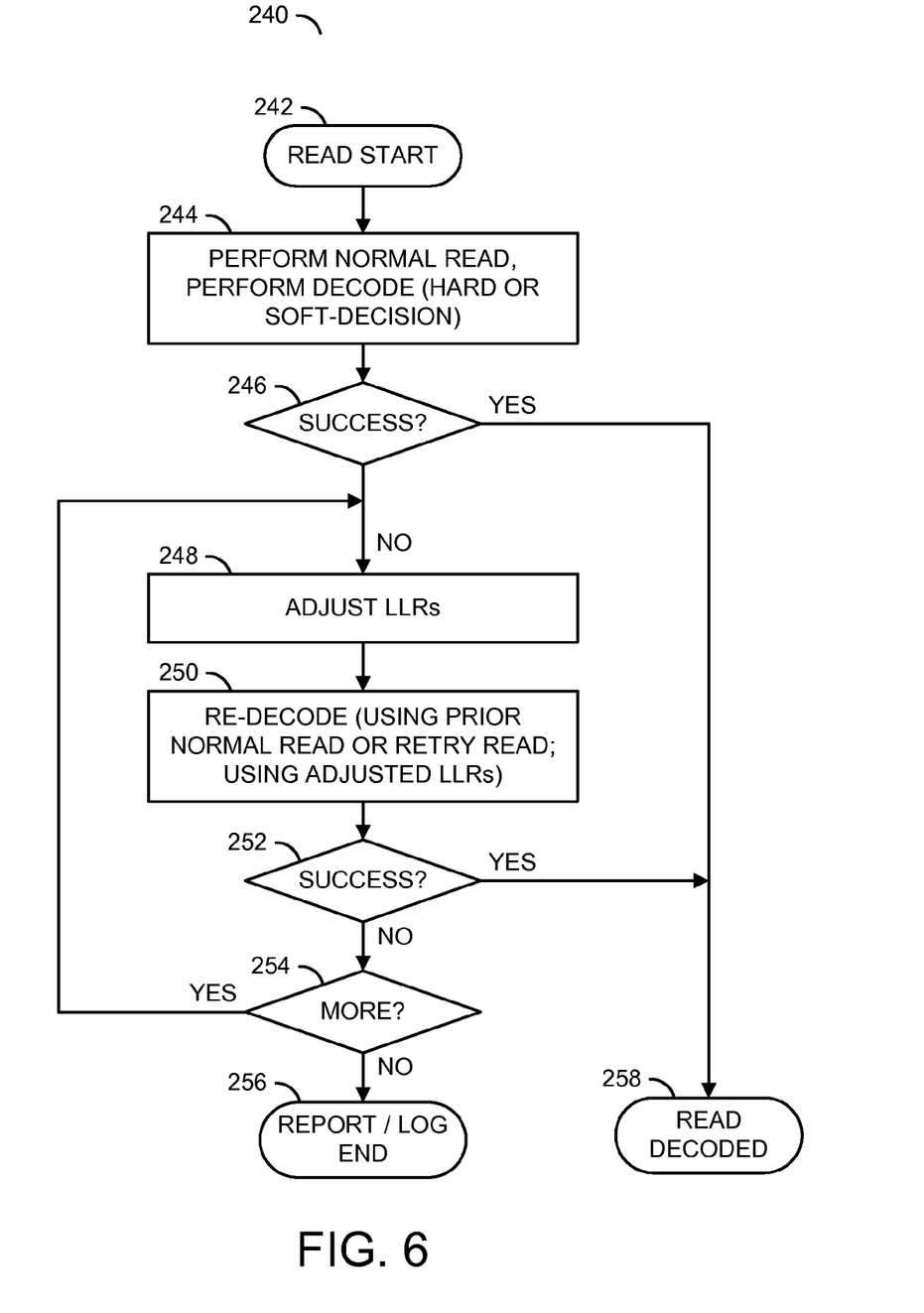
FIG. 6 is a flow diagram for performing a flash memory read assisted by log likelihood ratio compensation.

Referring to FIG. 6, a flow diagram of an example method 240 for performing a flash memory read assisted by the log likelihood ratio compensation is shown. The method (or process) 240 is generally implemented by the circuit 100 (e.g., the circuit 120). The method 240 generally comprises a step (or state) 242, a step (or state) 244, a step (or state) 246, a step (or state) 248, a step (or state) 250, a step (or state) 252, a step (or state) 254, a step (or state) 256 and a step (or state) 258. The steps 242 to 258 may represent modules and/or blocks that may be implemented as hardware, software, a combination of hardware and software, or other implementations. The sequence of the steps is shown as a representative example. Other step orders may be implemented to meet the criteria of a particular application.

The method 240 generally begins at the step 242 at the start of a read. The step 244 represents an attempt at performing a normal read and error correction code decode from the circuit 94. The read threshold voltages are generally previously set, but if not, may optionally be set or adjusted as appropriate. According to some embodiments, the error correction code decode is performed as a hard-decision decode, or as any of various soft-decision methods. The step 246 evaluates the success of the decode attempt of the step 244. If the decode was successful, the data read from the circuit 94 was either error-free or correctable as a result of the single decode attempt in the step 244. Control flow of the method 240 subsequently terminates for the flash memory read with the read data successfully decoded at the step 258.

If the decode attempt of the step 244 was not successful, the method 240 continues with the step 248. In the step 248, the circuit 120 adjusts the log likelihood ratio values currently in use to compensate for misplacements of the read voltages. In the step 250, a re-decoding is performed based on a prior read (whether a normal read or a retry read). If the re-decoding with the adjusted log likelihood ratio values is successful per the step 252, the method 240 terminates with the read data successfully decoded at the step 258.

If the re-decoding of the step 250 is unsuccessful, a check is made in the step 254 to determine if more attempts should be made. According to various embodiments, subsequent to a new retry read, the re-decoding can continue to attempt soft-decision decoding on the prior read data using different compensations of the log likelihood ratio values (corresponding to different read thresholds) up to a predetermined or configured count. Where different compensations are available, the step 254 returns the method 240 to the step 248 where the log likelihood ratio values are adjusted again. If all compensated re-decodings still fail, a failure report is logged in the step 256. The circuit 100 takes one or more actions based on the failure. The actions may include, but are not limited to, re-reading the circuit 94 using a different set of read voltages (e.g., read voltage V1 in FIG. 4 instead of read voltage V2 in FIG. 3).

Figure 7:
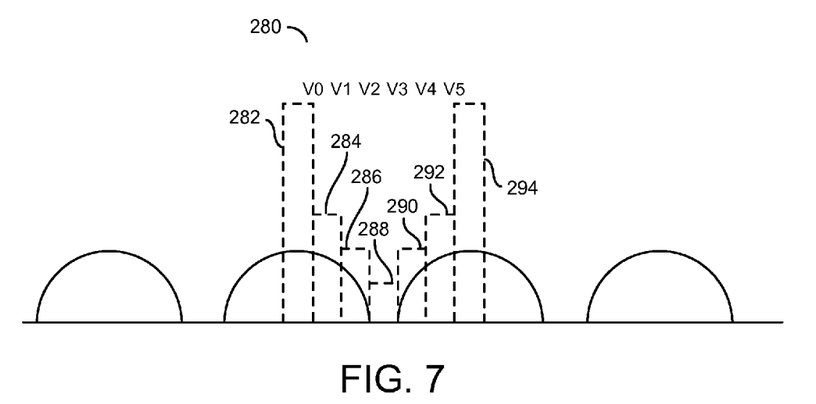
FIG. 7 is a diagram of a log likelihood ratio histogram.

Referring to FIG. 7, a diagram of an example histogram 280 of log likelihood ratio values is shown. The histogram 280 generally includes log likelihood ratio values 282-294 bracketing read voltages V0-V5. When a read is started, the initial read reference voltages and the distribution parameters are obtained by channel tracking technique. After a few retry reads, an updated channel estimation is available from such as the log likelihood ratio histogram 280. The initial set of log likelihood ratio values calculated for the circuit 94 used to estimate the cross points of the voltage threshold distributions. In the example, the smallest log likelihood ratio value 288 is centered approximately the crossing point to the middle two states.

Once the smallest log likelihood ratio value is found (e.g., 288), the boundary reference voltages (e.g., V2 and V3) around the smallest log likelihood ratio value are recorded. A new tracking reference voltage is an average of the boundary reference voltages (e.g., Vtrack_new=(V2+V3)/2). An offset voltage is a discrepancy (or difference) between the old tracking reference voltage (e.g., Vtrack_old) and the new tracking reference voltage (e.g., offset=Vtrack_new−Vtrack_old). The offset is applied in equation 6 below.

Figure 8:
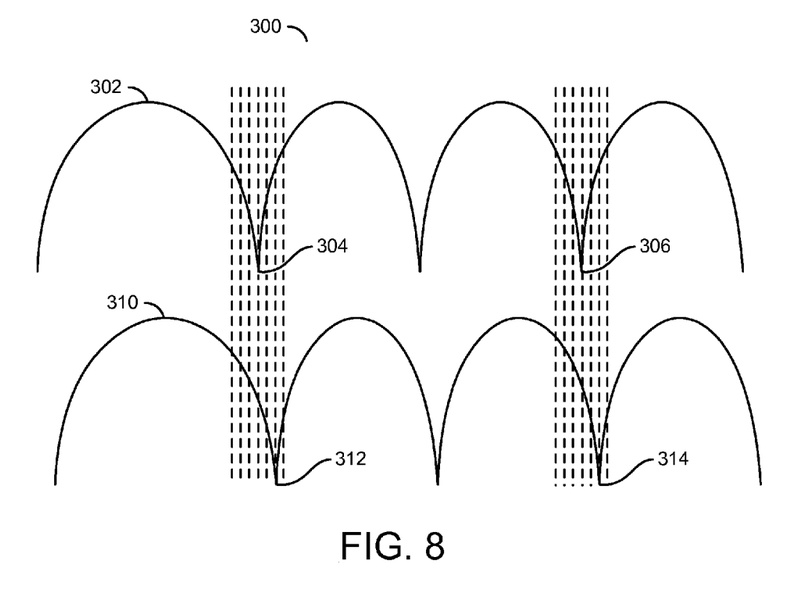
FIG. 8 is another diagram of shifted voltage threshold distributions.

Referring to FIG. 8, a diagram of an example shifted voltage threshold distributions 300 is shown. An initial set of distributions is illustrated as a curve 302. Some of the preferred crossing points for the distributions 302 are shown as voltages 204 and 306. A shifted set of distributions is illustrated as a curve 310. The crossing points for the distributions are shows as voltages 312 and 314.

Compensation of the log likelihood ratio values generally includes adjusting the log likelihood ratio values as stored in the circuit 116, re-map hard decision patterns according to the adjusted log likelihood ratio values and re-decode without re-reads. As shown in the figure, three read voltages (only two shown for clarity) are still desired values. The three desired voltages (e.g., 312 and 314) are able to have most benefit of soft read retry.

Figure 9:
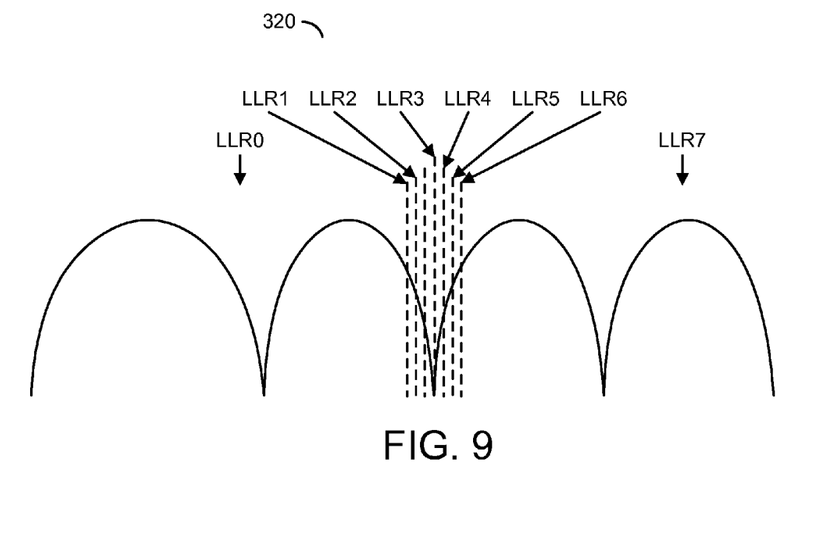
FIG. 9 is a diagram of log likelihood ratio values for a least significant bit page.

Referring to FIG. 9, a diagram of an example set 320 of log likelihood ratio values for the least significant bit page is shown. Various log likelihood ratio values (e.g., LLR1 to LLR6) are initially calculated for each of the possible read voltages. Outlier log likelihood ratio values (e.g., LLR0 and LLR7) are generally stand alone.

Figure 10:
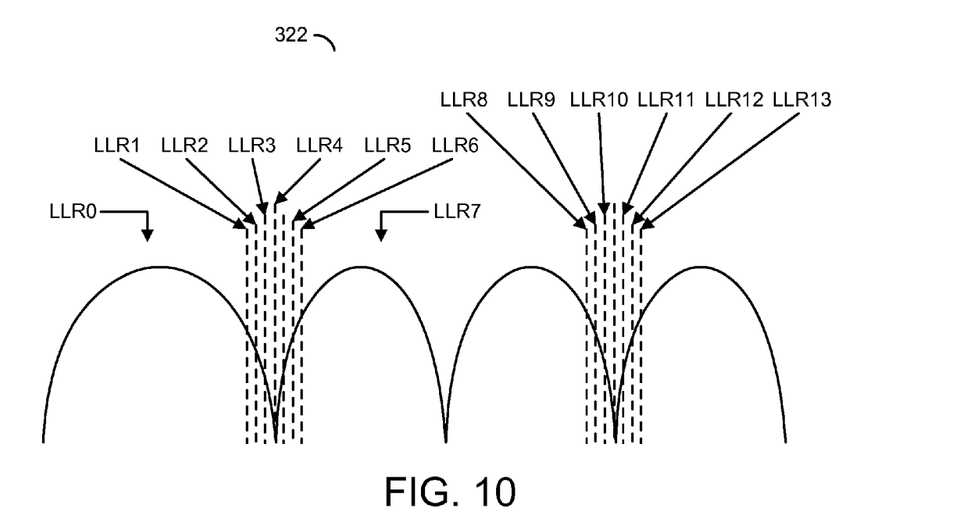
FIG. 10 is a diagram of log likelihood ratio values for a most significant bit page.

Referring to FIG. 10, a diagram of an example set 322 of log likelihood ratio values for a most significant bit page is shown. Various log likelihood ratio values (e.g., LLR1 to LLR6) are initially calculated for each of the possible lower read voltages used to distinguish between the lower two states. Additional log likelihood ratio values (e.g., LLR8 to LLR13) are initially calculated for each of the possible higher read voltages used to distinguish between the upper two states. The outlier log likelihood ratio values (e.g., LLR0 and LLR7) are stand alone.

Figure 11:
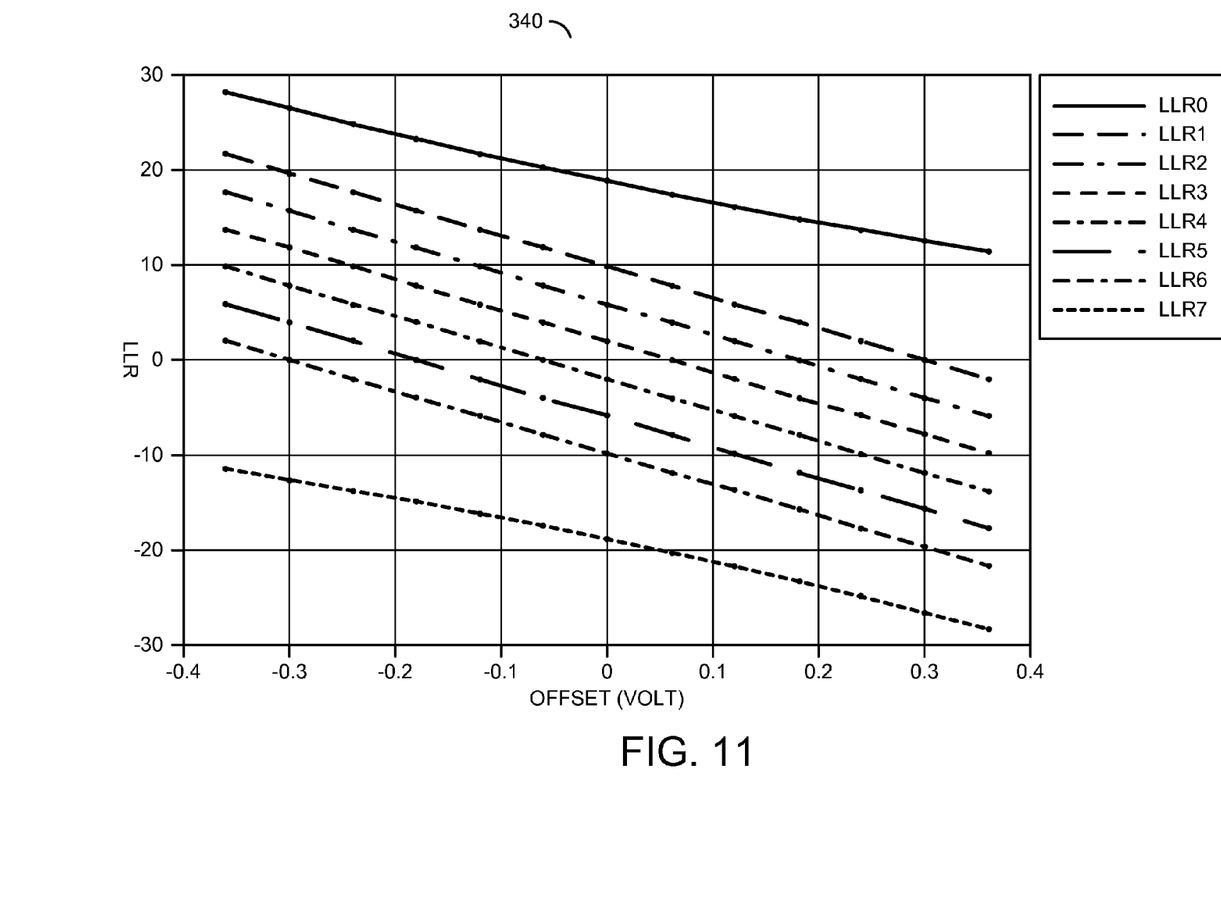
FIG. 11 is a diagram of a simulated results of log likelihood ratio value changes with misplacement of read voltages for a least significant bit page.

Referring to FIG. 11, a diagram of a simulated results 340 of log likelihood ratio value changes with misplacement of read voltages for the least significant bit page is shown. In general, all of the log likelihood ratio (e.g., LLR) values (e.g., LLR0 to LLR7) change linearly as the read voltage are offset from normal values. Lower compensated log likelihood ratio values account for increase read voltage misplacements.

Figure 12:
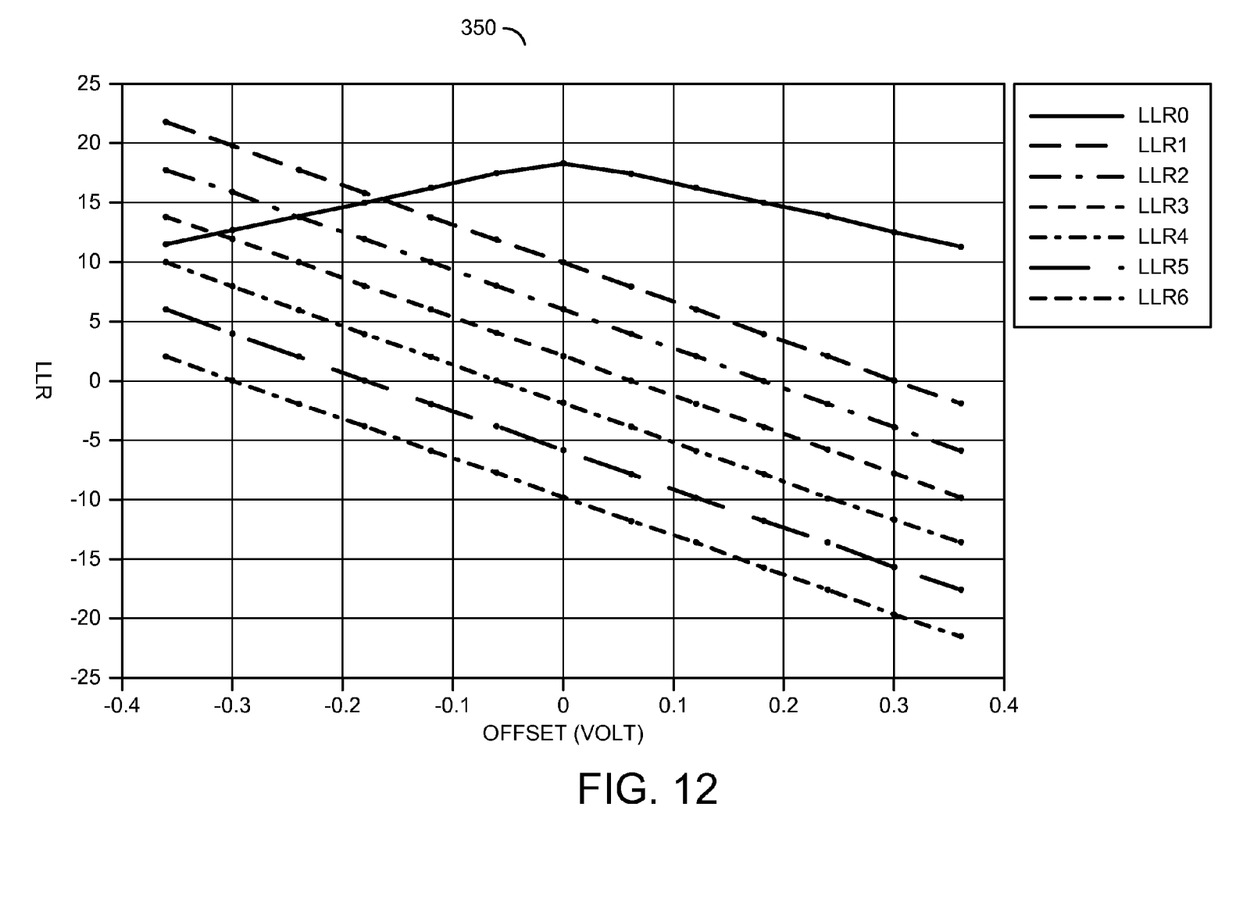
FIG. 12 is a diagram of a simulated results of some log likelihood ratio value changes with misplacement of read voltages for a most significant bit page.

Referring to FIG. 12, a diagram of a simulated results 350 of some log likelihood ratio value changes with misplacement of read voltages for the most significant bit page is shown. Most of the log likelihood ratio values (e.g., LLR1 to LLR6) change linearly as the read voltage are offset from normal values. Lower compensated log likelihood ratio values account for increase read voltage misplacements. The log likelihood ratio value 0 (e.g., LLR0) does not follow a generally linear curve.

Figure 13:
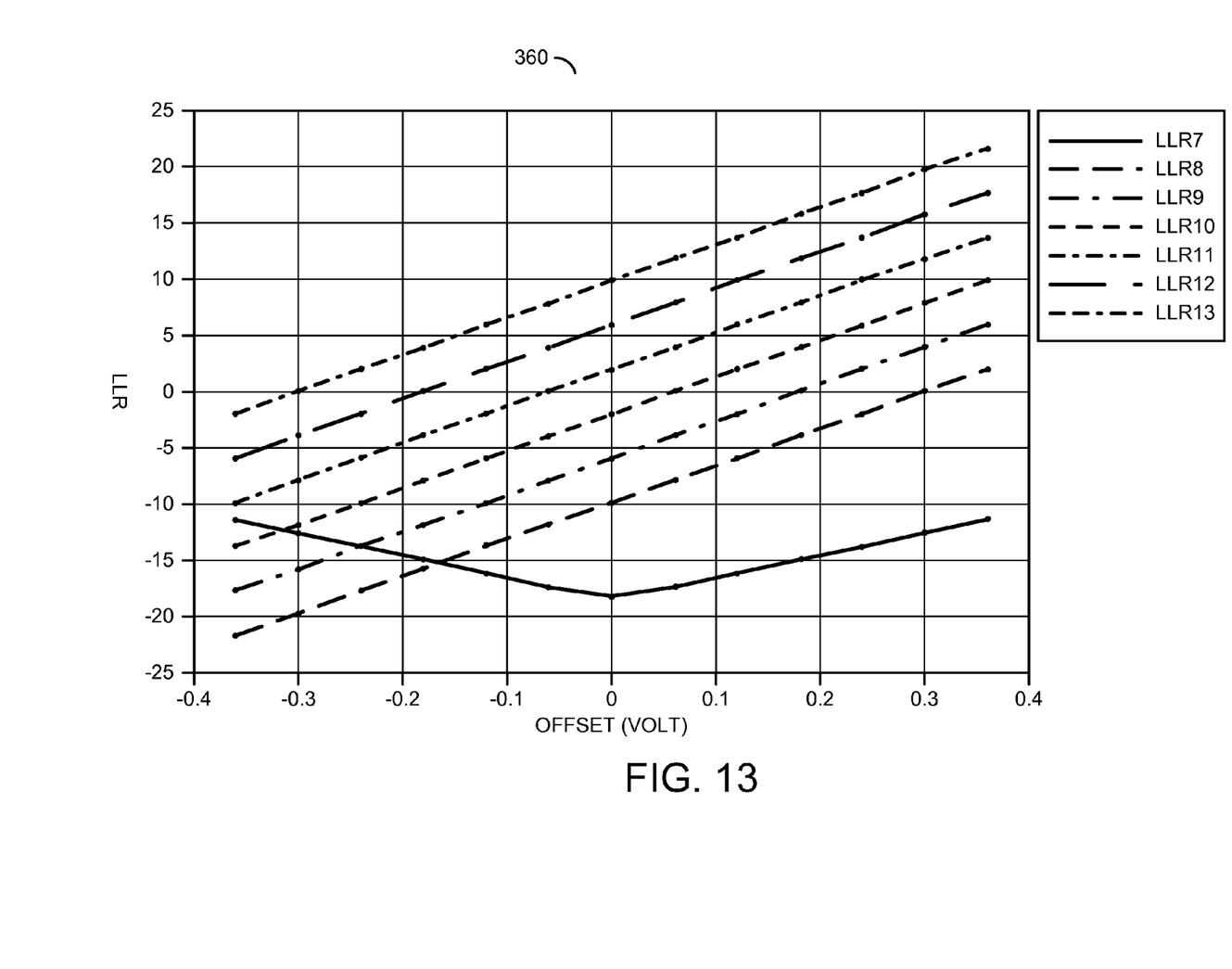
FIG. 13 is a diagram of a simulated results of the rest of log likelihood ratio value changes with misplacement of read voltages for the most significant bit page.

Referring to FIG. 13, a diagram of a simulated results 360 of the rest of log likelihood ratio value changes with misplacement of read voltages for the most significant bit page is shown. Most of the log likelihood ratio values (e.g., LLR8 to LLR13) change linearly as the read voltage are offset from normal values. Higher compensated log likelihood ratio values account for increase read voltage misplacements. The log likelihood ratio value 7 (e.g., LLR7) does not follow a generally linear curve.

Except log likelihood ratio value 0 and log likelihood ratio value 7 of a most significant bit (or upper) page read, all other log likelihood ratio values are linearly or approximately linear to an amount of the read voltage misplacement. The log likelihood ratio value 0 and the log likelihood ratio value 7 are log likelihood ratio values for the open decision regions of the most significant bit channel. By finding the slopes of log likelihood ratio changes, the amount of compensation can be simply a slope coefficient times an offset. The offset is estimated by log likelihood ratio histogram 280.

The log likelihood ratio for the narrow region (e.g., between read voltages V2 and V3 in FIG. 3) is calculated by equation 1 as follows:

$$LLR = \ln\left(\frac{\sum_{x=1} \int_{V2}^{V3} f(v; \mu_i, \sigma_i^2) dv}{\sum_{x=0} \int_{V2}^{V3} f(v; \mu_j, \sigma_j^2) dv}\right) \quad (1)$$

Where μ is an estimate mean of the state and σ is an estimated standard deviation of the state. Equation 1 can be approximated as equation 2 as follows:

$$LLR = \ln\left(\frac{\int_{V2}^{V3} f(v; \mu_n, \sigma_n^2) dv}{\int_{V2}^{V3} f(v; \mu_{n+1}, \sigma_{n+1}^2) dv}\right) \quad (2)$$

Consider equation 3 as follows:

$$\int_{V2}^{V3} f(v; \mu, \sigma^2) dv = (V3 - V2) \times f(0.5(V3 + V2); \mu, \sigma^2) \quad (3)$$

Using equation 3, equation 2 can be simplified into equation 4 as follows:

$$LLR = \ln\left(\frac{f(0.5(V3 + V2); \mu_n, \sigma_n^2)}{f(0.5(V3 + V2); \mu_{n+1}, \sigma_{n+1}^2)}\right) \quad (4)$$

For a specific read voltage V, the log likelihood ratio value is given by equation 5 as follows:

$$LLR(V) = \ln(\sigma_{n+1}) - \ln(\sigma_n) + \frac{(V - \mu_{n+2})^2}{2\sigma_{n+1}^2} - \frac{(V - \mu_n)^2}{2\sigma_n^2} \quad (5)$$

Using the offset from the histogram 280, the amount of compensation is given by equation 6 as follows:

$$LLR\_delta = LLR(V) - LLR(V + \text{offset}) \quad (6)$$

The offset voltage is a difference between the old tracking reference voltage and the new tracking reference voltage as defined by the smallest log likelihood ratio value in the histogram 280. Therefore, the flow of the log likelihood ratio value is given by equation 7 as follows:

$$\text{Slope} = -(LLR\_delta)/\text{offset} \quad (7)$$

Once the slope has been determined, the amount of compensation applied to a log likelihood ratio value can be the slope coefficient times the offset.

The functions performed by the diagrams of FIGS. 1-13 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a memory configured to store data; and
a controller configured to process a plurality of input/output requests to read/write to/from the memory, calculate a plurality of log likelihood ratio values over a range of a plurality of read voltages of the memory, store a portion less than all of the plurality of log likelihood ratio values that correspond to a portion less than all of the plurality of read voltages in one or more tables in the controller, perform one or more attempts of a soft-decision decode of the data stored in the memory using the log likelihood ratio values stored in the one or more tables, generate one or more adjusted log likelihood ratio values by adding a constant value to one or more of the log likelihood ratio values stored in the one or more tables in response to a failure to decode the data using the log likelihood ratio values, and perform one or more attempts to re-decode the data using the one or more adjusted log likelihood ratio values.

2. The apparatus according to claim 1, wherein the controller is further configured to generate a plurality of further adjusted log likelihood ratio values by adding a plurality of different values to the log likelihood ratio values stored in the one or more tables in response to a failure of the re-decode using the one or more adjusted log likelihood ratio values.

3. The apparatus according to claim 2, wherein the controller is further configured to perform one or more attempts to re-decode the data using the plurality of further adjusted log likelihood ratio values.

4. The apparatus according to claim 2, wherein the plurality of different values are related to a plurality of misplacements of the plurality of read voltages from an initial set of the read voltages used to sense the data.

5. The apparatus according to claim 4, wherein the different values have a corresponding linear relationship to the plurality of misplacements of the plurality of read voltages.

6. The apparatus according to claim 4, wherein the plurality of different values are calculated based on a corresponding slope coefficient and an offset value.

7. The apparatus according to claim 6, wherein the offset value is estimated from a histogram of the log likelihood ratio values.

8. The apparatus according to claim 1, wherein the one or more adjusted log likelihood ratio values are not stored in the one or more tables.

9. The apparatus according to claim 1, wherein the memory and the controller form part of a solid-state drive.

10. A method to compensate for misplacement of a plurality of read voltages of a memory, comprising the steps of:
calculating a plurality of log likelihood ratio values over a range of the plurality of read voltages of the memory;
storing a portion less than all of the plurality of log likelihood ratio values that correspond to a portion less than all of the plurality of read voltages in one or more tables;
processing a plurality of input/output requests to read/write to/from the memory;
performing one or more attempts of a soft-decision decode of data stored in the memory using the log likelihood ratio values stored in the one or more tables;
generating one or more adjusted log likelihood ratio values by adding a constant value to one or more of the log likelihood ratio values stored in the one or more tables in response to a failure to decode the data using the log likelihood ratio values; and
performing one or more attempts to re-decode the data using the one or more adjusted log likelihood ratio values.

11. The method according to claim 10, further comprising the step of:
generating a plurality of further adjusted log likelihood ratio values by adding a plurality of different values to the log likelihood ratio values stored in the one or more tables in response to a failure of the re-decode using the one or more adjusted log likelihood ratio values.

12. The method according to claim 11, further comprising the step of:
performing one or more attempts to re-decode the data using the plurality of further adjusted log likelihood ratio values.

13. The method according to claim 11, wherein the plurality of different values are related to a plurality of misplacements of the plurality of read voltages from an initial set of the plurality of read voltages used to sense the data.

14. The method according to claim 13, wherein the plurality of different values have a corresponding linear relationship to the plurality of misplacements of the plurality of read voltages.

15. The method according to claim 13, wherein the different values are calculated based on a corresponding slope coefficient and an offset value.

16. The method according to claim 15, wherein the offset value is estimated from a histogram of the plurality of log likelihood ratio values.

17. The method according to claim 10, wherein the one or more adjusted log likelihood ratio values are not stored in the one or more tables.

18. The method according to claim 10, wherein the steps are performed in a solid-state drive.

19. An apparatus comprising:
an interface configured to process a plurality of read/write operations to/from a memory; and
a control circuit configured to calculate a plurality of log likelihood ratio values over a range of a plurality of read voltages of the memory, store a portion less than all of the plurality of log likelihood ratio values that correspond to a portion less than all of the plurality of read voltages in one or more tables in the control circuit, perform one or more attempts of a soft-decision decode of data stored in the memory using the log likelihood ratio values stored in the one or more tables, generate one or more adjusted log likelihood ratio values by adding a constant value to one or more of the log likelihood ratio values stored in the one or more tables in response to a failure to decode the data using the log likelihood ratio values, and perform one or more attempts to re-decode the data using the one or more adjusted log likelihood ratio values.

20. The apparatus according to claim 19, wherein the interface and the control circuit form part of a solid-state drive controller.

* * * * *